United States Patent [19]

Shan

[11] Patent Number: 5,683,517
[45] Date of Patent: Nov. 4, 1997

[54] PLASMA REACTOR WITH PROGRAMMABLE REACTANT GAS DISTRIBUTION

[75] Inventor: Hongching Shan, San Jose, Calif.

[73] Assignee: Applied Materials, Inc., Santa Clara, Calif.

[21] Appl. No.: 475,877

[22] Filed: Jun. 7, 1995

[51] Int. Cl.$^6$ .................................................. C23C 16/00
[52] U.S. Cl. ........................... 118/723 E; 118/723 ER
[58] Field of Search .................. 118/723 E, 723 ER, 118/723 I, 723 IR, 723 MN, 723 MP; 156/345; 204/298.07, 298.33; 216/71, 68, 69

[56] References Cited

U.S. PATENT DOCUMENTS

| | | | |
|---|---|---|---|
| 5,500,256 | 3/1996 | Watabe | 427/579 |
| 5,522,934 | 6/1996 | Suzuki et al. | 118/723 AN |
| 5,532,190 | 7/1996 | Goodyear et al. | 437/225 |

*Primary Examiner*—John Niebling
*Assistant Examiner*—Joni Y. Chang
*Attorney, Agent, or Firm*—Michaelson & Wallace

[57] ABSTRACT

A plasma reactor for processing a semiconductor wafer inside a vacuum chamber has an array of gas distribution orifices in said chamber facing respective underlying portions of a top surface of said wafer, a gas flow supply, apparatus for individually coupling gas to respective ones of said gas distribution orifices from said gas flow supply at respective individual gas flow rates whereby respective gas flow rates over said respective underlying portions of said top surface of said wafer are respectively determined and apparatus for igniting a plasma inside said chamber from gases contained therein for processing said wafer.

18 Claims, 2 Drawing Sheets

PLASMA REACTOR WITH PROGRAMMABLE REACTANT GAS DISTRIBUTION

BACKGROUND OF THE INVENTION

1. Technical Field

The invention is related to gas distribution apparatus in a plasma reactor for processing semiconductor wafers, such as a gas distribution plate in the ceiling of the reactor chamber.

2. Background Art

Plasma reactors useful for chemical vapor deposition or etching of thin films on semiconductor wafers include a vacuum chamber into which reactant gases are introduced and ignited into a plasma with radio frequency (RF) power to produce surface chemical or plasma-assisted chemical reactions at the wafer-gas interface. The uniformity across the wafer surface of the deposition rate or etch rate is affected by many parameters including the nature of the reactive gases in the chamber, the chamber pressure, temperature, gas flow rate, RF power and chamber shape. The most important parameter affecting uniformity is the gas flow pattern across the wafer surface. To the extent that the gas flow pattern at the wafer surface is non-uniform, the deposition rate or etch rate will be non-uniform across the wafer surface. Such non-uniformity is a problem in that different devices at different locations on the wafer surface will be formed differently increasing the probability that some of them will be defective, thereby reducing the production yield of good devices on the wafer.

Viewed microscopically at the wafer surface, the local deposition rate or local etch rate is determined primarily by surface conditions and the reactant gas species flow rate at the particular location. Therefore, it is imperative that both the magnitude and direction of the gas flow be as uniform as possible across the entire wafer surface.

In conventional plasma reactors, reactant gases are combined in a manifold and then delivered to the reactor chamber via a single gas feed line to a gas distribution plate in the ceiling of the chamber. The gas distribution plate has many gas flow orifices in an area overlying the wafer, and the placement of these orifices determines whether the gas flow is uniform across the wafer surface. Since the orifices are permanent features of the gas distribution plate, their precise placement for optimum uniformity of gas flow must be learned through expensive and time-consuming trial-and-error experiments. Typically, gas distribution patterns are tailored for a specific application (e.g., chemical vapor deposition of a particular material to a particular thickness over a particular layer for a particular size wafer), so that for each such application the trial-and-error method of optimizing placement of the gas orifices in the gas distribution plate must be repeated.

It is an object of the present invention to eliminate the need for customizing each gas distribution plate with such an inefficient trial-and-error method.

SUMMARY OF THE DISCLOSURE

Gas flow is independently adjustable at each point in a grid over the wafer surface. Individual reactant gases are mixed together to form a homogeneous reactant gas mixture for the plasma. A programmable flow divider then provides the homogeneous mixture to each individual gas orifice of the gas distribution plate at an individually selectable flow rate, so that a different flow rate may be selected for each different gas orifice in the gas distribution plate. The flow rates are instantaneously adjustable for fast optimization of gas flow uniformity across the entire wafer surface.

One significant advantage of the invention is that it provides a new parameter for controlling or quickly adjusting the plasma processing of a semiconductor wafer, namely the gas flow pattern across the wafer surface. A related advantage is that a plasma reactor embodying the invention can be quickly changed to satisfy a far wider range of processing requirements. For example, some etch processes have higher etch rates near the wafer center and lower etch rates near the wafer edge while for others the center etch rates are lower and the edge etch rates are higher. In the invention, the plasma reactor's gas flow pattern across the wafer surface may compensate for a center-fast and edge-slow process. Then, after this process is completed, the reactor's gas flow pattern may be quickly adjusted to compensate for a subsequent process which is center-slow and edge-fast, for example. Thus, the same plasma reactor may be employed to perform successive processes which heretofore have required different plasma reactors with fixed gas flow patterns.

Another advantage is that the ideal gas flow pattern for a specific process may be quickly determined by trial-and-error adjustment of the gas flow pattern across the entire wafer surface using the array controller to quickly and independently change the gas flow rates at all gas distribution orifices. Thus, the user may develop a particular process much faster, since there is no prolonged hardware design, fabrication and testing steps that must be carried out during process development.

Another advantage is that the invention may be employed in both plasma etch processes and plasma deposition (e.g., chemical vapor depostion) processes. The invention may be employed to optimize the gas flow uniformity across the entire wafer surface in either an etch process or a deposition process. The etch process may be a dielectric etch process, a polysilicon etch process or a metal etch process.

The invention is embodied in a plasma reactor for processing a substrate at a processing station within a reactor in a subatmospheric gaseous environment, the reactor being adapted to be provided with an evacuation pump, a supply of gas, and a source of electromagnetic radiation to ignite a plasma within the gaseous environment. The reactor includes an array of gas distribution orifices opening into the reactor and directed toward a substrate processing station and an array of first mass flow controllers, each respectively controlling a subset of gas distribution orifices, the gas flow rate over each portion of said processing station facing a respective subset of said orifices being independently controlled. Each of the first mass flow controllers controls the gas flow rate from a respective one of the orifices. Each subset of the orifices is grouped so as to be associated with predetermined distinct respective facing zones of the substrate processing station. Each of the first flow controllers is responsive to an electrical control input signal. The plasma reactor may further include a programmable array controller providing a plurality of the electrical control signals so as to control at least a plurality of the first flow controllers simultaneously and independently and provide thereby simultaneous control of individual orifice gas flows independently of each other. The plasma reactor may further include a plurality of second mass flow controllers, each accepting a supply of a particular gas and having a common output to the first mass flow controllers, and providing a controllable and predetermined mix of process gases to the first mass controllers. The orifices maybe supported within an electrically conductive support member adapted to be coupled to a source of RF power.

DETAILED DESCRIPTION OF THE PREFERRED EMBODIMENTS

Figure 1:
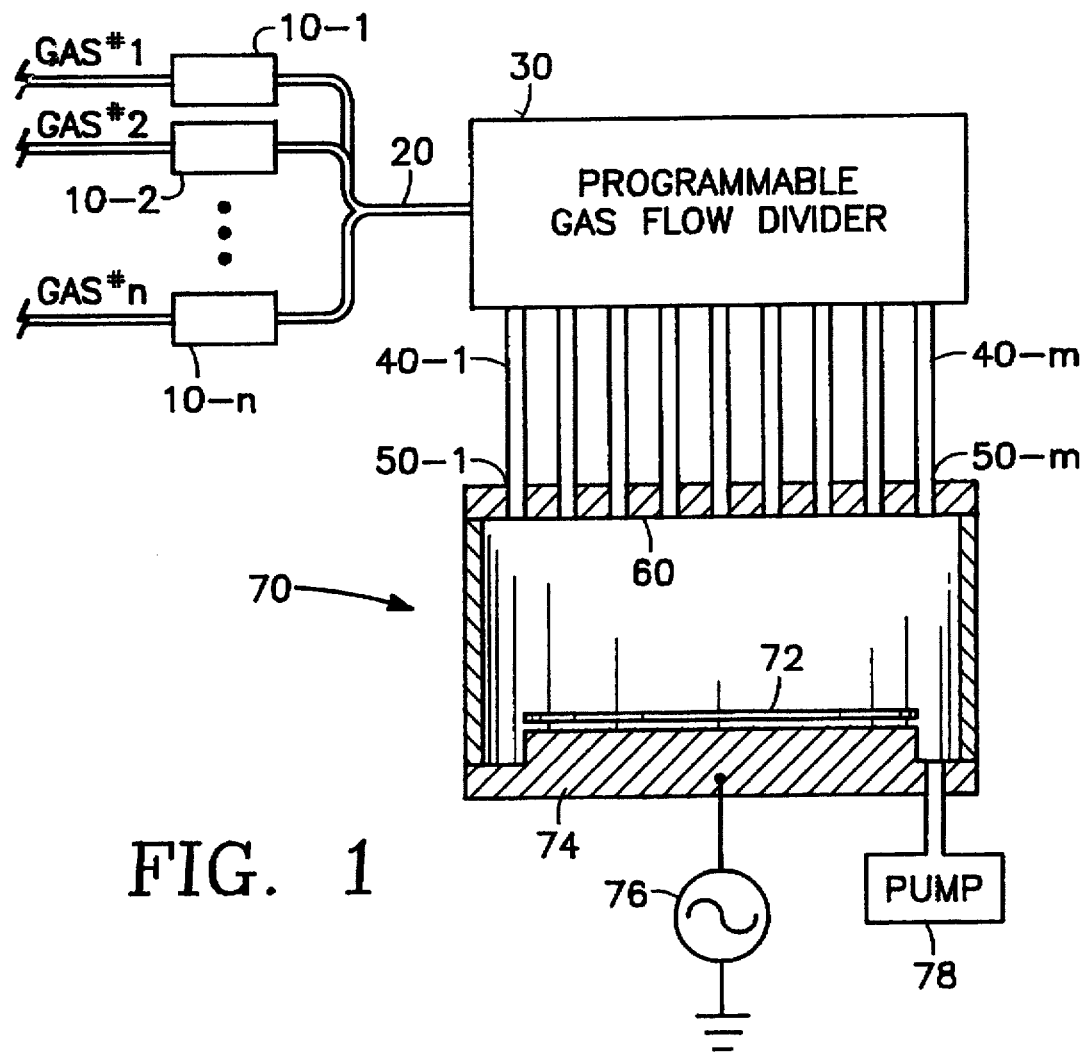
FIG. 1 is a schematic diagram of an embodiment of the invention.

Referring to FIG. 1, individual reactant gases (labelled gas #1 through gas #n in FIG. 1) are fed through respective conventional mass flow controllers 10-1 through 10-n to a common gas feed line 20 where the individual gases become a homogeneous mixture. This mixture is fed by the line 20 to a programmable gas flow divider 30 having m gas output lines 40-1 through 40-m. Each output line 40 is connected to a respective one of m gas flow orifices 50-1 through 50-m in a gas distribution plate 60. The gas distribution plate is near the ceiling of a plasma reactor chamber 70 in which a wafer 72 rests on a cathode 74 to which RF power from an RF source 76 is applied. The gas distribution plate 60 may serve as the anode, so that a plasma is ignited and maintained between the gas distribution plate 60 and the cathode 74. A vacuum pump 78 maintains a desired gas pressure within the chamber 70.

Figure 2:
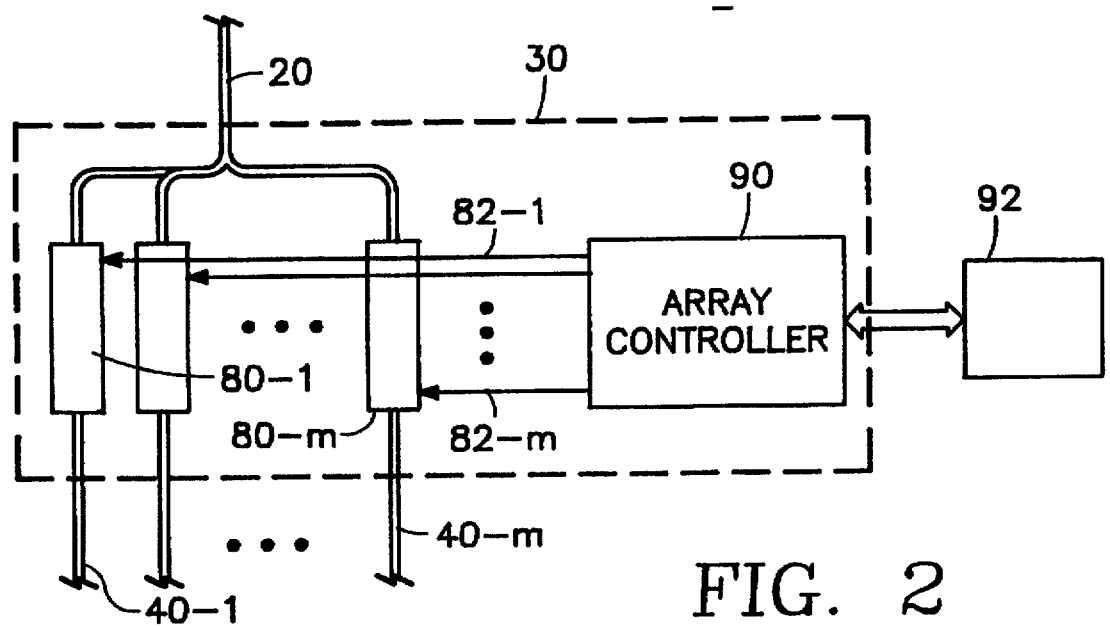
FIG. 2 is a schematic diagram of a programmable gas flow divider employed in the embodiment of FIG. 1.

Referring to FIG. 2, the programmable gas flow divider 30 may be implemented in one embodiment by m conventional mass flow controllers 80-1 through 80-m. Each one of the mass flow controllers 80-1 through 80-m receives the homogeneous gas mixture from the feed line 20 and supplies an individually selected flow rate of the homogeneous gas mixture to a respective one of the output lines 40-1 through 40-m. The individual gas flow rate through each mass flow controller 80 is varied or set by an electrical signal applied to an electrical control input line 82 connected to an electrical control input of the mass flow controller. All of the control lines 82-1 through 82-m are connected to an array controller 90 which permits the user to exercise instantaneous control over each mass flow controller 80 in the array of mass flow controllers 80-1 through 80-m. The array controller 90 may have a standard computer interface 92 permitting instantaneous computerized control over the flow rate through each one of the mass flow controllers 80-1 through 80-m.

Figure 3:
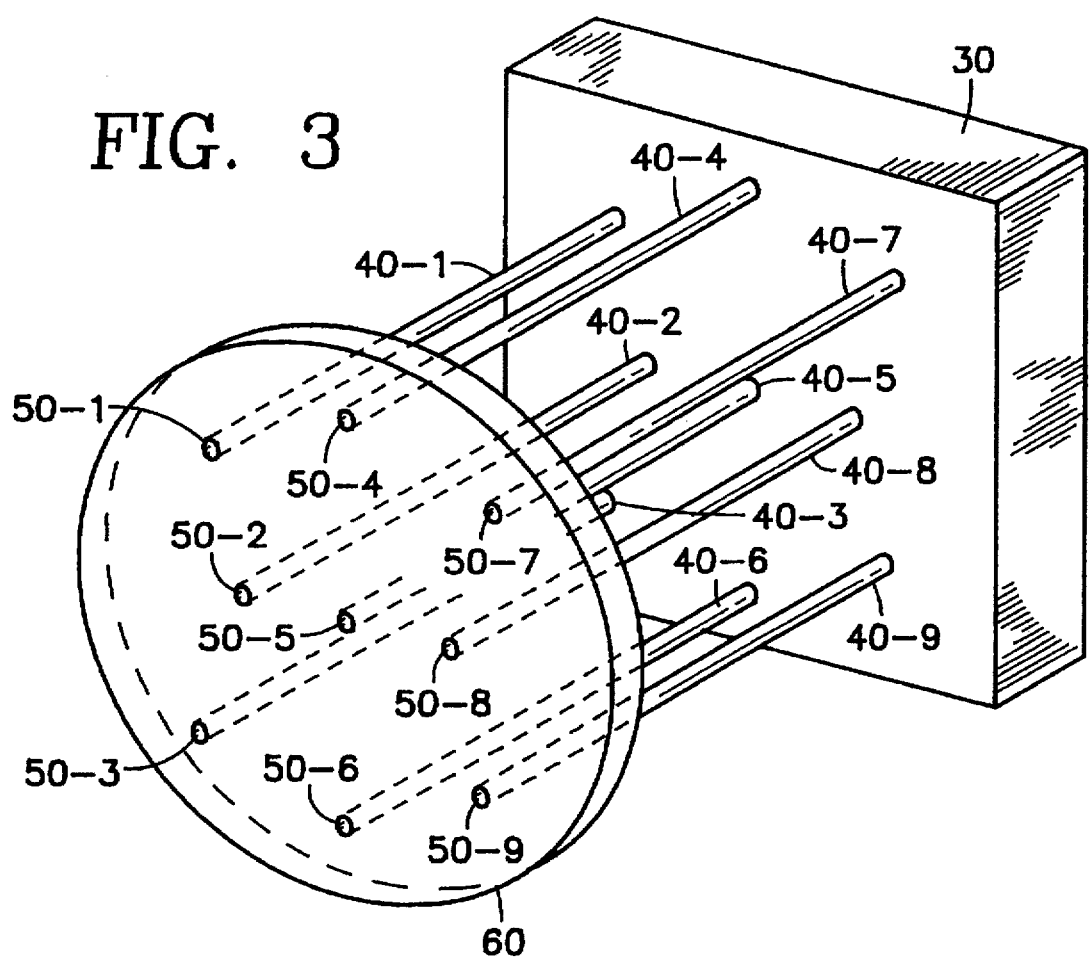
FIG. 3 is a perspective view of a gas distribution plate and programmable gas flow divider employed in the embodiment of FIG. 1.
Figure 4:
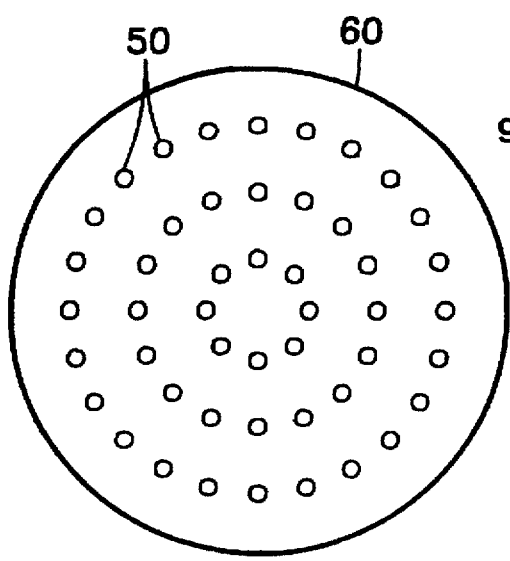
FIG. 4 is a bottom view of a gas distribution plate which may be used in the embodiment of FIG. 1.

FIG. 3 illustrates a rudimentary implementation of the gas distribution plate 60 having about eight gas flow orifices 50-1 through 50-8 connected to eight gas output lines 40-1 through 40-8 from the programmable gas flow divider 30. FIG. 4 shows a preferred embodiment of the gas distribution plate 60 having large number of orifices 50 which are closely spaced, enabling very fine high resolution control of the gas flow pattern over the wafer surface. Preferably, for processing an eight-inch diameter semiconductor wafer, the gas distribution plate 60 has a diameter of about 10 inches and has about 100 gas flow orifices 50, and each gas flow orifice 50 has a diameter of about 20 mils.

Figure 5:
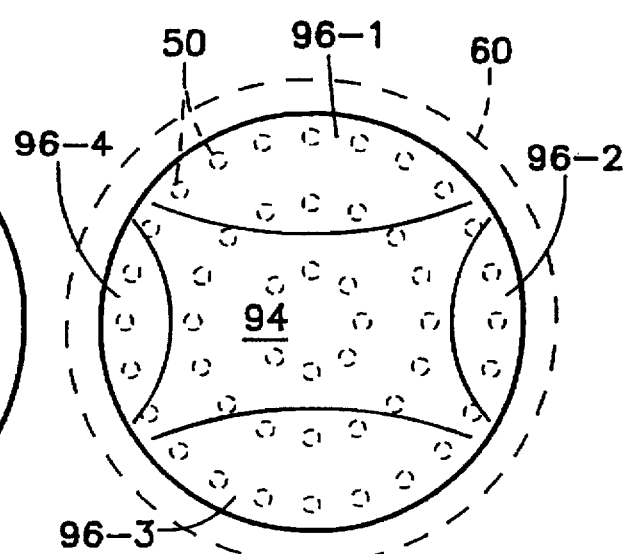
FIG. 5 is a graph illustrating the gas flow distribution non-uniformity across the wafer surface as compensated by the invention.

FIG. 5 illustrates how the mass flow controllers 80 might be individually set to precisely compensate for non-uniformities in gas flow across the wafer surface. Specifically, a region 94 centered over the wafer 72 and having arcuately stretched corners tends to have a low gas flow rate (and therefore low etch rate) while four adjoining regions 96-1 through 96-4 constituting the remaining area overlying the wafer have high gas flow rates. To obtain a uniform gas flow rate, those mass flow controllers 80 connected to orifices 50 overlying the center region 94 are set to a relatively high flow rate while the remaining mass flow controllers (which are connected to the orifices 50 overlying the remaining areas 96-1 through 96-4) are set to lower flow rates, and these flow rates are so adjusted until a uniform gas flow rate is achieved across the entire wafer surface.

One significant advantage of the invention is that it provides a new parameter for controlling or quickly adjusting the plasma processing of a semiconductor wafer, namely the gas flow pattern across the wafer surface. A related advantage is that a plasma reactor embodying the invention can be quickly changed to satisfy a far wider range of processing requirements. For example, some etch processes have higher etch rates near the wafer center and lower etch rates near the wafer edge while for others the center etch rates are lower and the edge etch rates are higher. In the invention, the plasma reactor's gas flow pattern across the wafer surface may compensate for a center-fast and edge-slow process. Then, after this process is completed, the reactor's gas flow pattern may be quickly adjusted to compensate for a subsequent process which is center-slow and edge-fast, for example. Thus, the same plasma reactor may be employed to perform successive processes which heretofore have required different plasma reactors with fixed gas flow patterns.

Another advantage is that the ideal gas flow pattern for a specific process may be quickly determined by trial-and-error adjustment of the gas flow pattern across the entire wafer surface using the array controller to quickly and independently change the gas flow rates at all gas distribution orifices. Thus, the user may develop a particular process much faster, since there are no prolonged hardware design, fabrication and testing steps that must be carried out during process development.

Another advantage is that the invention may be employed in both plasma etch processes and plasma depostion (e.g., chemical vapor depostion) processes. The invention may be employed to optimize the gas flow uniformity across the entire wafer surface in either an etch process or a deposition process. The etch process may be a dielectric etch process, a polysilicon etch process or a metal etch process.

While the invention has been described in detail with reference to embodiments in which the plasma reactor is a capacitively coupled plasma reactor having a pair of electrodes, the invention may also be carried out using any suitable means for igniting and maintaining a plasma within the chamber, including a coil antenna wrapped around the chamber for an inductively coupled plasma or a microwave plasma reactor such as an ECR plasma reactor, or a combination of any of the foregoing.

While the invention has been described in detail by reference to preferred embodiments, it is understood that variations and modifications thereof may be made without departing from the true spirit and scope of the invention.

What is claimed is:

1. A plasma reactor for processing a semiconductor wafer inside a vacuum chamber, comprising:

an array of gas distribution orifices in said chamber facing respective underlying portions of a top surface of said wafer;

a gas flow supply;

a programmable gas flow divider for individually coupling gas to respective ones of said gas distribution orifices from said gas flow supply at respective individual gas flow rates whereby respective gas flow rates over said respective underlying portions of said top surface of said wafer are respectively determined; and a radiation applicator for igniting a plasma inside said chamber from gases contained therein for processing said wafer.

2. The apparatus of claim 1 wherein said reactor comprises a gas distribution plate near a ceiling of said chamber overlying said wafer and wherein said orifices comprise individual passages through said gas distribution plate.

3. The apparatus of claim 1 wherein said programmable gas flow divider comprises plural mass flow controllers, each one of said mass flow controllers having a gas input connected to said supply line, a gas output connected to a respective one of said orifices and an electrical control input for setting a gas flow rate between said input and output in accordance with an electrical signal applied to said control line.

4. The apparatus of claim 3 further comprising an array controller connected to each control line for simultaneously controlling individual gas flow rates through each of said orifices.

5. The apparatus of claim 1 wherein said radiation applicator irradiates an interior of said chamber with RF power.

6. The apparatus of claim 1 further comprising means for establishing a desired gas pressure within said chamber.

7. A plasma reactor for processing a semiconductor wafer inside a vacuum chamber, comprising:

an array of gas distribution orifices in said chamber facing respective underlying portions of a top surface of said wafer;

a gas flow supply;

an array of respective mass flow controllers controlling gas flow rates in respective ones of said gas distribution orifices whereby respective gas flow rates over said respective underlying portions of said top surface of said wafer are respectively determined; and a power applicator for igniting a plasma inside said chamber from gases contained therein for processing said wafer.

8. The apparatus of claim 7 wherein said reactor comprises a gas distribution plate near a ceiling of said chamber overlying said wafer and wherein said orifices comprise individual passages through said gas distribution plate.

9. The apparatus of claim 7 wherein each one of said respective mass flow controllers has a gas input connected to said gas flow supply, a gas output connected to a respective one of said orifices and an electrical control input for setting a gas flow rate between said input and output in accordance with an electrical signal applied to said control line.

10. The apparatus of claim 9 further comprising an array controller connected to each control line for simultaneously controlling individual gas flow rates through each of said orifices.

11. The apparatus of claim 7 wherein said power applicator irradiates an interior of said chamber with RF power.

12. The apparatus of claim 7 further comprising means for establishing a desired gas pressure within said chamber.

13. A plasma reactor for processing a substrate at a processing station within a reactor in a subatmospheric gaseous environment, said reactor being adapted to be provided with an evacuation pump, a supply of gas, and a source of electromagnetic radiation to ignite a plasma within the gaseous environment, said reactor comprising:

an array of gas distribution orifices opening into said reactor and directed toward a substrate processing station; and an array of first mass flow controllers, each respectively controlling a gas flow rate from a one of said gas distribution orifices;

whereby a gas flow rate over each portion of said processing station facing a respective subset of said orifices may be independently controlled.

14. A plasma reactor as in claim 13, in which each said subset of said orifices is grouped so as to be associated with distinct respective facing zones of said substrate processing station.

15. A plasma reactor as in claim 13, in which each of said first flow controllers is responsive to an electrical control input signal.

16. A plasma reactor as in claim 15, which further includes a programmable array controller providing a plurality of said electrical control signals so as to control at least a plurality of said first flow controllers simultaneously and independently and provide thereby simultaneous control of individual orifice gas flows independently of each other.

17. A plasma reactor as in claim 16, which further includes a plurality of second mass flow controllers, each accepting a supply of a particular gas and having a common output to said first mass flow controllers, and providing a controllable mix of process gases to said first mass controllers.

18. A plasma reactor as in claim 13, in which said orifices are supported within an electrically conductive support member adapted to be coupled to a source of RF power.

* * * * *